(12) United States Patent
Ikeda

(10) Patent No.: US 7,338,878 B2
(45) Date of Patent: Mar. 4, 2008

(54) METHOD FOR FORMING CAPACITOR IN SEMICONDUCTOR DEVICE

(75) Inventor: Noriaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/447,147

(22) Filed: Jun. 6, 2006

(65) Prior Publication Data
US 2006/0275997 A1    Dec. 7, 2006

(30) Foreign Application Priority Data
Jun. 6, 2005    (JP) ............................. 2005-166262

(51) Int. Cl.
*H01L 21/20* (2006.01)
(52) U.S. Cl. ...................... 438/386; 438/387
(58) Field of Classification Search ................ 438/386, 438/387, 388, 389, 390, 391, 392, 393, 394, 438/395, 396, 397, 398, 399
See application file for complete search history.

(56) References Cited

U.S. PATENT DOCUMENTS

| 5,943,581 | A | * | 8/1999 | Lu et al. ..................... 438/386 |
| 6,008,103 | A | * | 12/1999 | Hoepfner .................... 438/386 |
| 6,215,187 | B1 | * | 4/2001 | Ooto et al. ................. 257/758 |
| 6,284,593 | B1 | * | 9/2001 | Mandelman et al. ....... 438/248 |
| 6,700,153 | B2 | * | 3/2004 | Oh et al. .................... 257/309 |
| 6,911,364 | B2 | * | 6/2005 | Oh et al. .................... 438/253 |
| 6,967,137 | B2 | * | 11/2005 | Belyansky et al. ......... 438/246 |
| 2005/0067630 | A1 | * | 3/2005 | Zhao .......................... 257/134 |
| 2006/0086951 | A1 | | 4/2006 | Iijima et al. |

FOREIGN PATENT DOCUMENTS

JP    11-204751 A    7/1999

* cited by examiner

*Primary Examiner*—Zandra V. Smith
*Assistant Examiner*—Swapneel Chhaya
(74) *Attorney, Agent, or Firm*—McDermott Will & Emery LLP

(57) ABSTRACT

Upon a deep-hole capacitor fabrication, a hole is formed in an insulator layer, and then a film of a conductive material is formed on the insulator layer and on the whole inner surface of the hole. The film and the insulator layer are exposed to a chemical-mechanical polishing process to form a lower electrodes of the conductive material. A capacitor dielectric on the lower electrode is formed, and then an upper electrode is formed on the capacitor dielectric.

13 Claims, 10 Drawing Sheets

METHOD FOR FORMING CAPACITOR IN SEMICONDUCTOR DEVICE

BACKGROUND OF THE INVENTION

This invention relates to a semiconductor device including a capacitor especially a forming method of the capacitor.

In order to fabricate a high density semiconductor memory device such as a dynamic random access memory (DRAM) device, a storage capacitor must take up less planar area in each memory cell. On the other hand, a sufficiently high charge capacity must be maintained while a storage capacitor is scaled down in dimensions. Efforts to maintain charge capacity have concentrated on building three-dimension capacitor structures that increase a capacitor surface area. One of the three-dimension capacitor structures is referred to as a deep hole capacitor which generally extends significantly above a surface on an underlying substrate in order to provide the capacitor with a large surface area and thus sufficient storage capacity. Such deep-hole capacitor is disclosed in, for example, US 2006/0086961 A1, which is incorporated herein by reference.

As a matter known to the inventor, a hole deeper than 2000 nm has a sidewall on which a bowing shape appears in a plane perpendicular to a substrate. In other words, the deeper hole is formed with a particular vase-shaped profile which has upper and lower sections; the upper section has larger sizes with increased depths, while the lower section has smaller sizes with increased depths. The particular vase-shaped profile leads to problems in the subsequent formation processes, especially, a void or a seam undesirably formed in an upper electrode of a capacitor.

SUMMARY OF THE INVENTION

It is an object of the present invention to provide a new capacitor formation method which can solve the above-mentioned problem even if a hole has the particular vase-shaped profile temporally in the capacitor formation processes.

According to one aspect of the present invention, a method for forming a capacitor, comprising: providing a substrate with an insulator layer, forming a hole in the insulator layer, the hole having an opening, a side surface and a bottom surface; forming a film of a conductive material on the insulator layer and on the side surface and the bottom surface of the hole; exposing the film and the insulator layer to a chemical-mechanical polishing process to form a lower electrode of the conductive material; forming a capacitor dielectric on the lower electrode; and forming an upper electrode on the capacitor dielectric.

An appreciation of the objectives of the present invention and a more complete understanding of its structure may be had by studying the following description of the preferred embodiment and by referring to the accompanying drawings.

Figure 1:
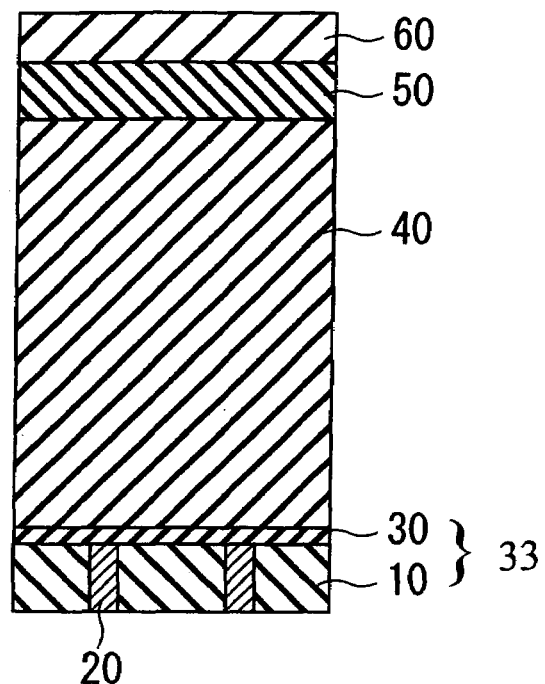
FIGS. 1 to 6 are views showing capacitor formation processes in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIGS. 1 to 6, a method for forming a capacitor according to the first embodiment of the present invention is explained below.

With reference to FIG. 1, conductive plugs 20 are formed in a first insulator layer 10. The first insulator layer 10 of this embodiment is made of silicon oxide, while the conductive plugs 20 of this embodiment are made of poly-silicon. Each of the conductive plugs 20 is formed in a hole of the first insulator layer 10 by depositing a poly silicon material on the first insulator layer 10 by a chemical vapor deposition (CVD) process, followed by removing the deposited silicon material formed out of the hole of the first insulator layer by a dry etch process wherein the CVD process uses a monosilane ($SiH_4$) gas and a phosphine ($PH_3$) gas as source gases and is carried out so that phosphorus additives are contained in the deposited silicon material. The conductive plug 20 may be formed by forming a amorphous silicon plug, followed by exposing the amorphous silicon plug to a heat treatment process to change it into the poly silicon plug 20. The CVD process may use a disilane ($Si_2H_6$) gas and a $PH_3$ gas as source gases.

Over the conductive plug 20 and the first insulator, a silicon nitride film 30 is formed by another CVD process which uses a dichlorosilane ($SiH_2Cl_2$) gas and an ammonia ($NH_3$) gas as source gases in this embodiment; the thickness of the silicon nitride film 30 of the present embodiment is 50 nm. In the illustrated example, the silicon nitride film 30 is formed after the formation of the conductive plug 20 but may be formed before the formation of the conductive plug.

The first insulator layer 10 and the silicon nitride film 30 function as a substrate 33 on which a second insulator layer 40 is formed by a plasma CVD process which uses a tetraethoxysilane ($Si(OC_2H_5)_4$) gas and an oxygen ($O_2$) gas as source gases in this embodiment. The second insulator layer 40 according to the present embodiment is made of silicon oxide and has the thickness 2500 nm.

Furthermore, a hardmask 50 is formed on the second insulator layer 40 by another CVD process. The hardmask 50 of the present embodiment is made of silicon oxide and has a thickness 500 nm. Alternatively, the hardmask may be made of amorphous carbon. On the hardmask 50, a photoresist layer 50 is formed by spin coating process. Thus, a structure shown in FIG. 1 is obtained.

Figure 2:
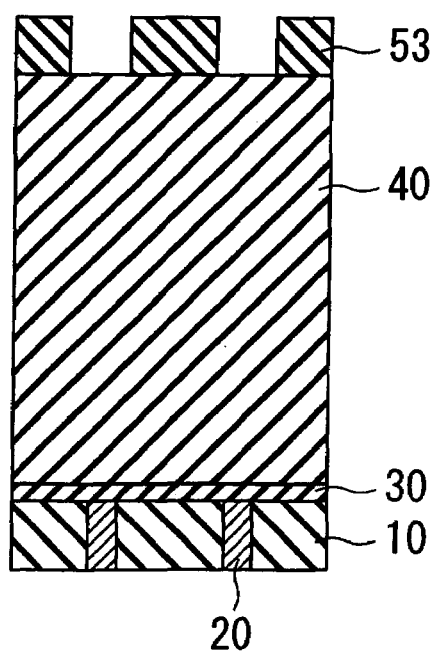

With reference to FIG. 2, the hardmask 50 is patterned by a photolithography process and a dry etch process so that the patterned hardmask 53 is obtained. For example, the dry etch process may use a mixture of a chlorine ($Cl_2$) gas, a hydrogen bromide (HBr) gas and an $O_2$ gas; its exemplary pressure condition is set to 10 mtorr, and its exemplary plasma power condition is set to 100 W. Generally, its gas condition is mainly composed of a $Cl_2$ gas.

Figure 3:
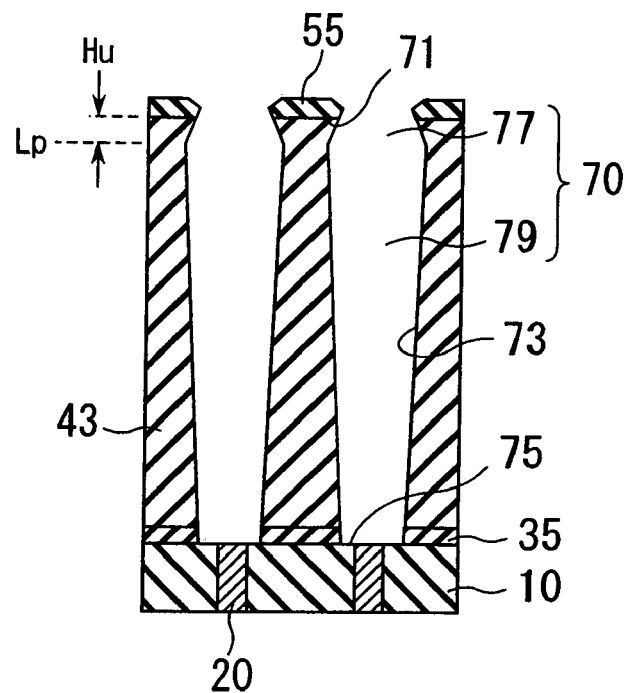

Next, the second insulator layer 40 is exposed to an anisotropic etch process by using the patterned hardmask 53 so that a deep hole 70 is formed in the etched second insulator layer 43 with a thinner hardmask 55, as shown in FIG. 3; the thinner hardmask 55 may be completely removed during the anisotropic etch process. For example, the anisotropic etch process may use a mixture of an octafluorocyclopentane ($C_5F_8$) gas, and argon (Ar) gas and an $O_2$ gas; its exemplary pressure condition is set to 100 mtorr, and its exemplary plasma power condition is set to 150 W. Generally, its gas condition is mainly composed of a fluorine (F) based gas, and higher plasma power is required to take an ionization effect. In this embodiment, the silicon nitride film 30 is also etched during the anisotropic etch process so that the hole reaches the conductive plug 20 to obtain a patterned silicon nitride film 35.

As shown in FIG. 3, the hole 70 has an opening 71, a side surface 73 and a bottom surface 75 and has the above-mentioned particular vase-shaped profile which has an upper section 77 and a lower section 79. The upper section 77 extends downwardly from the opening 71 to a predetermined level Lp and has larger sizes with increased depths. On the other hand, the lower section extends from the predetermined level Lp to the bottom surface 75 and has smaller sizes with increased depths. In other words, the upper section 77 is widened, while lower section 79 is tapered, as seen from their above. In this embodiment, the height Hu of the upper section 77, i.e. a distance from the opening 71 to the predetermined level Lp, is 300 nm. As a result of statistical analysis, the inventor has found out a fact that the height Hu becomes 200 nm to 300 nm when the hole 70 has a depth of 2500 nm to 3000 nm.

Figure 4:
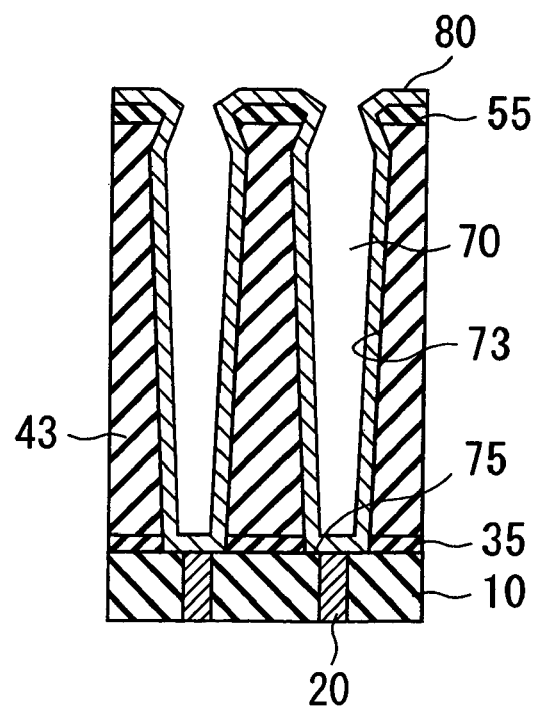

Next, with reference to FIG. 4, the top of the conductive plug 20 is exposed to a resistance-lowering process, and then a film 80 of a conductive material is formed on the etched hardmask 55 and on the inner surface of the hole 70, i.e. the side surface 73 and the bottom surface 75, by a CVD process, followed by a heat treatment process; the deposited film is made of amorphous silicon containing phosphorus and has a thickness of 30 nm; and the heat treatment process is performed at 700° C. so that it is changed into the film 80 which is made of poly silicon and is conductive. The heat treatment process may be carried out afterwards but, even in that case, the conductive film 80 is regard as being formed at the deposition process in this embodiment because its physical position is unrelated to the heat treatment process.

Instead of the silicon film, a film made of metal such as tungsten (W), tungsten nitride (WN) or ruthenium (Ru) may be formed on the etched hardmask 55 and on the inner surface of the hole 70. If the metal film is used, the top surface of the conductive plug 20 is preferably covered with an anti-silicidation layer.

Figure 5:
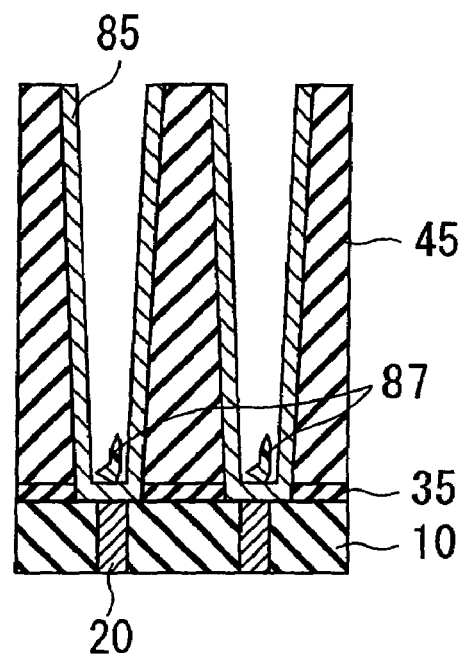

Next, the etched hardmask 55, the film 80 and the etched second insulator layer 43 are exposed to a chemical-mechanical polishing (CMP) process to form a lower electrode 85 and the polished insulator layer 45, as shown in FIG. 5. In this embodiment, the CMP process removes the etched hardmask 55, the film 80 and the etched second insulator layer 43 so that hole 70 has only the lower section 79. In other words, the end point of the CMP process is the predetermined level Lp. Normally, because a polishing rate is known to a user using a polishing machine, the user can control the polished amount by selecting a suitable polishing period. Since the predetermined level Lp is regularly positioned lower than the opening 71 by 200 nm to 300 nm, it is sufficient that the predetermined level Lp is estimated as one of 200 nm to 300 nm, based on which a suitable polishing period is selected.

The CMP process also generates residues 87 such as chippings and/or slurry residues in the hole 70. The residues 87 should be removed because they lead to problems in subsequent deposition processes. The residues such as chippings are removed by an oxygen-plasma ashing process and a rinse process by using an organic based solution. The residues such a slurry residues are removed by a rinse process by using a hydrofluoric acid (HF) solution.

Note here that the CMP process is performed after the formation of the film 80, i.e. the material of the lower electrode 85, in this embodiment. Therefore, the lower electrode 85 can protect the inner surface of the hole 70 from the HF solution rinse process.

Figure 6:
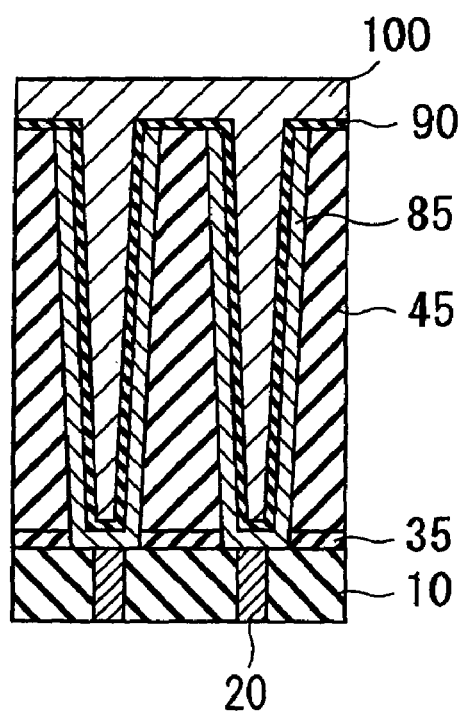

As shown in FIG. 6, a capacitor dielectric 90 is formed or the lower electrode 85, and then an upper electrode 100 is formed on the capacitor dielectric 90 so that the capacitor is obtained.

In detail, an oxygen film naturally formed on the lower electrode 85 is removed by a rinse process, and then the lower electrode 85 is exposed to a heat treatment process at 750° C. under an $NH_3$ atmosphere to form a thin silicon nitride film on the lower electrode 85; the thin silicon nitride film has a thickness of 1 nm. Then, a tantalum oxide film is formed on the thin silicon nitride film by a CVD process which uses a pentaethoxytantalum ($Ta(OC_2H_5)_5$) gas and an $O_2$ gas as source gases; the thickness of the tantalum oxide film is 8 nm. Next, a heat treatment process is carried out at 750° C. under a nitrous oxide ($N_2O$) atmosphere for the purpose of crystallization and oxygen supplement to the deposited tantalum oxide film; the heat treatment process also changes the thin silicon nitride film into silicon oxynitride film. Thus, the capacitor dielectric 90 is obtained. Apparent from the above-mentioned processes and FIG. 6, the capacitor dielectric 90 of the present embodiment also covers a top surface of the insulator layer 85. The formation of the capacitor dielectric 90 may use an atomic layer deposition (ALD) process instead of the CVD process. As ALD process can form a more superior film than CVD process, the heat treatment process after the deposition of the tantalum oxide film may be omitted or may be carried out at lower temperature. In addition, in case of the ALD process, the capacitor dielectric 90 may be comprised of one or more layers made of aluminum oxide or hafnium oxide. If the capacitor dielectric 90 is made of aluminum oxide or hafnium oxide, titanium nitride (TiN) may be also used as a material of the lower electrode 85.

Next, the upper electrode 100 made of TiN is formed on the capacitor dielectric 90 by a CVD process which uses a titanium chloride ($TiCl_4$) gas and an $NH_3$ gas as source gases. The upper electrode 100 may further comprise a tungsten (W) film formed by a spattering process. Namely, the upper electrode 100 may be stacked TiN layer and W film.

Now, explanation will be made about a capacitor formation method according to the second embodiment of the present invention, with reference to FIGS. 7 to 9. The second embodiment is a modification of the first embodiment and has the same processes as shown in FIGS. 1 to 4.

Figure 7:
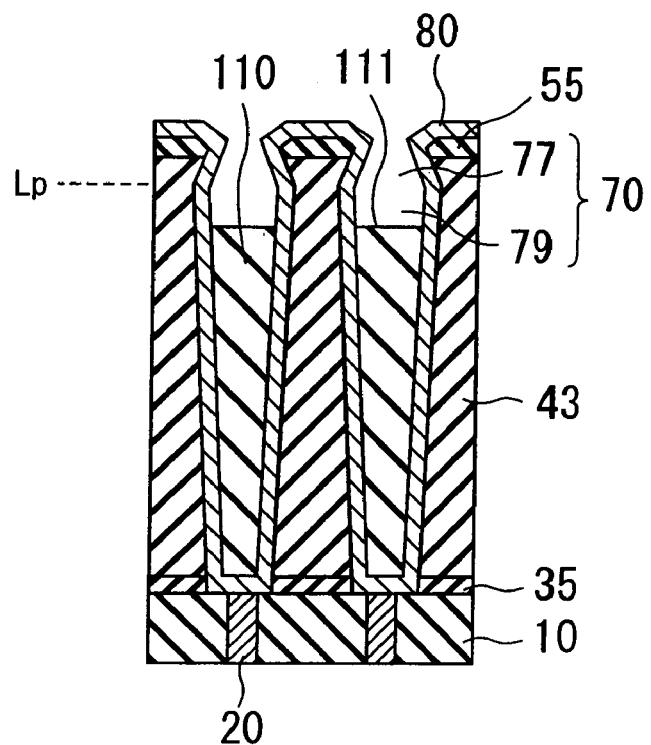
FIGS. 7 to 9 are views showing capacitor formation processes in accordance with a second embodiment of the present invention.

After the formation of the film 80 shown in FIG. 4, the hole 70 is filled in part with a protective material 110 in this embodiment, as shown in FIG. 7. The protective material 110 of the present embodiment is made of photoresist. In detail, the hole 70 is completely filled with a photoresist material by a spin coating process, and then the photoresist material is exposed by a photolithography process such that the top surface 111 of the protective material 110 is positioned lower than the predetermined level Lp.

Figure 8:
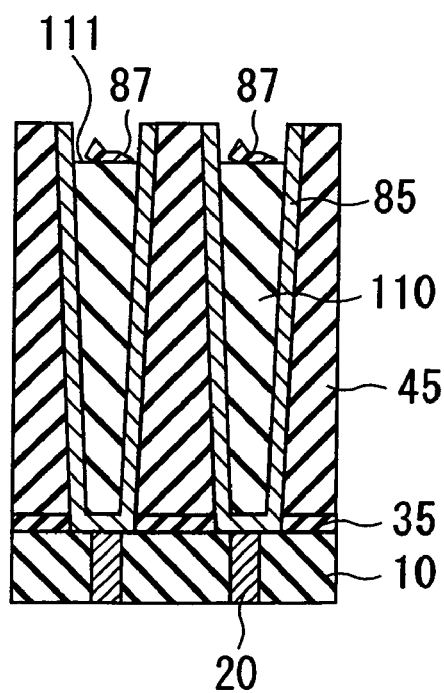
Figure 9:
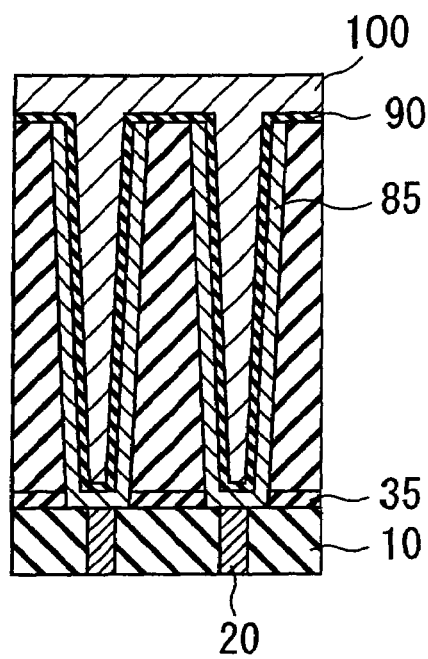

Next, the etched hardmask 55, the film 80 and the etched second insulator layer 43 are exposed to a CMP process to form a lower electrode 85 and the polished insulator layer 45, as shown in FIG. 8. In this embodiment, as the protective material 110 is filled in part with the hole 70, residues 87 are laid on the top surface 111 of the protective material 110. Therefore, the protective material 110 can protect the inner surface of the hole 70 from the residue removal process such as an oxygen-plasma ashing process and a HF rinse process as explained in the first embodiment.

After the residue removal process, the protective material 110 made of photoresist is removed, and then the capacitor dielectric 90 and the upper electrode 100 are formed in turn in a manner similar to the processes of the first embodiment. Thus, the capacitor of the second embodiment can be obtained as shown in FIG. 9.

Now, explanation will be made about a capacitor formation method according to the third embodiment of the present invention, with reference to FIGS. 10 to 14. The third embodiment is another modification of the first embodiment and has the same processes as shown in FIGS. 1 to 4.

Figure 10:
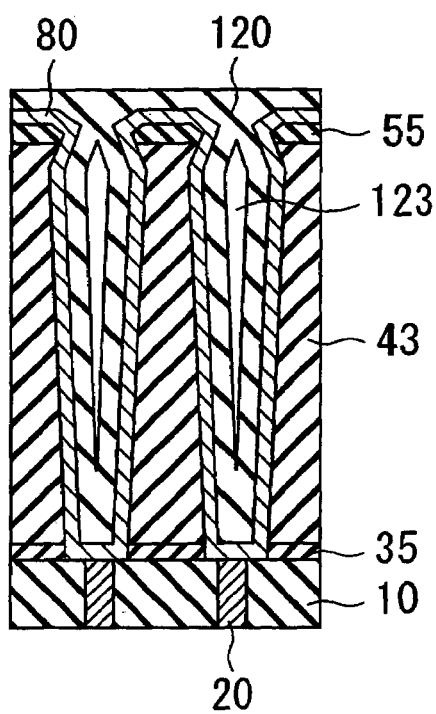
FIGS. 10 to 14 are views showing capacitor formation processes in accordance with a third embodiment of the present invention.

After the formation of the film 80 shown in FIG. 4, the hole is filled with a protective material 120 in this embodiment, as shown in FIG. 10. The protective material 120 is made of silicon oxide and is formed with a void 123 by a CVD process, which uses an SiH4 gas and an $O_2$ gas as source gases and is carried out at 400° C. The CVD process may use an $SiH_4$ gas and an $N_2O$ gas as source gases and be carried out at 750° C. The protective material may be formed by spin coating; the protective material may be SOG (spin on glass) material.

Figure 11:
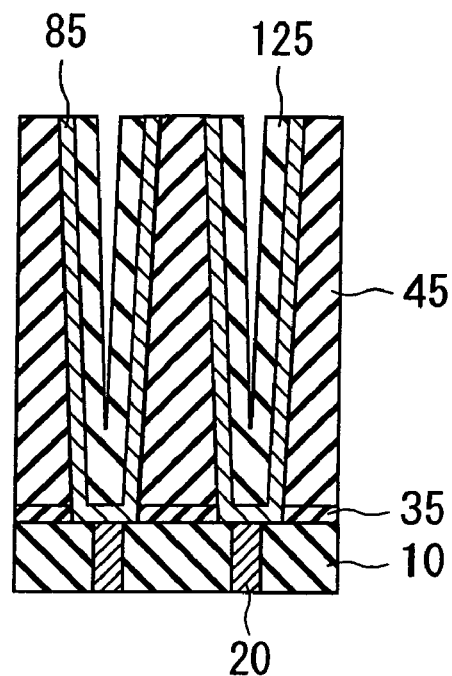

Next, the etched hardmask 55, the film 80, the etched second insulator layer 43 and the protective material 120 are exposed to a CMP process to form a lower electrode 85, the polished insulator layer 45 and the polished protective material 125, as shown in FIG. 11. In this embodiment, the protective material 125 is formed with a concave due to the void 123, and the residues (not shown) fall in the concave of the protective material 125.

Figure 12:
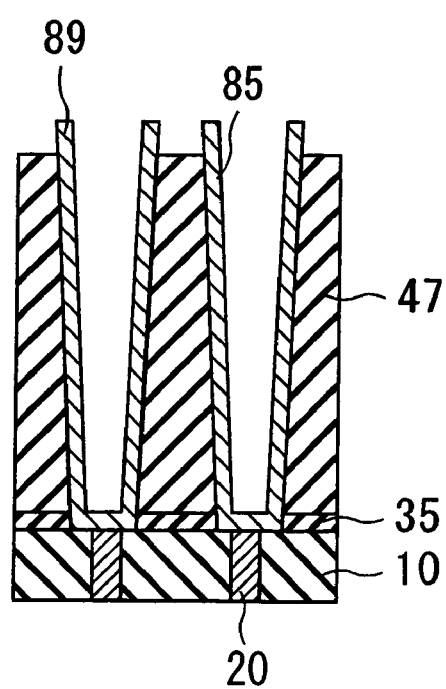

Next, the protective material 125 is removed by an HF solution etch process, as shown in FIG. 12. The HF solution etch process also removes residues such as slurry residues, while residues such as chippings are lifted off upon the removal of the protective material 125. At the same time, the etched insulator layer 45 is further etched so that the lower electrode 85 has a projecting film 85 above the insulator layer 47. The projecting rim 89 provides the lower electrode 85 with a larger surface in comparison with, for example, the structure of the first embodiment so that the large capacity can be obtained in accordance with the present embodiment.

Figure 13:
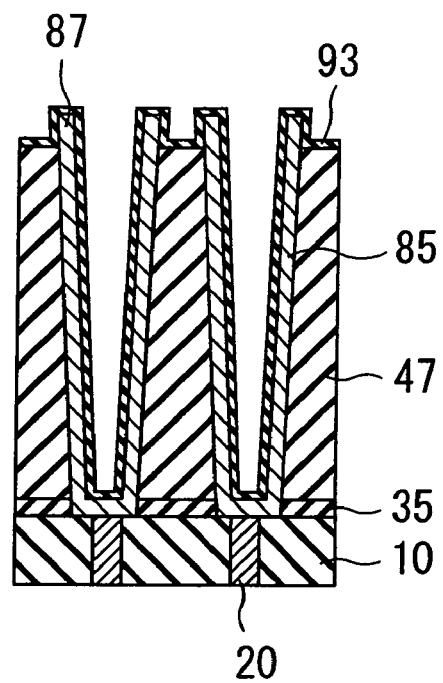
Figure 14:
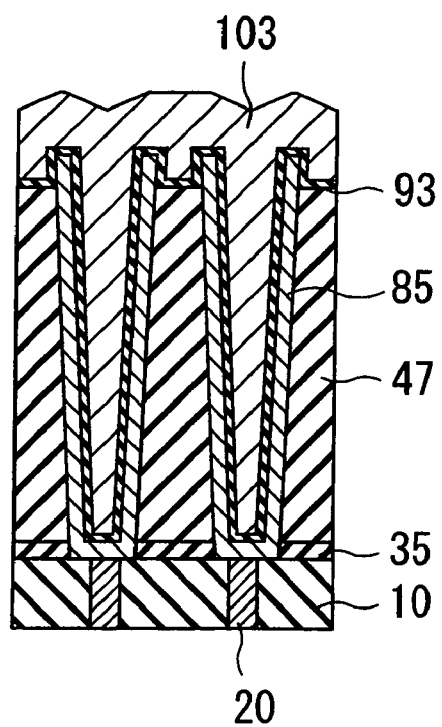

Next, a capacitor dielectric 93 is formed on the lower electrode 85, as shown in FIG. 13. Then, an upper electrode 103 is formed on the capacitor dielectric 93, as shown in FIG. 14, so that the capacitor is obtained.

Now, explanation will be made about a capacitor formation method according to the fourth embodiment of the present invention, with reference to FIGS. 15 to 20. The fourth embodiment is a modification of the first and the third embodiments.

Figure 15:
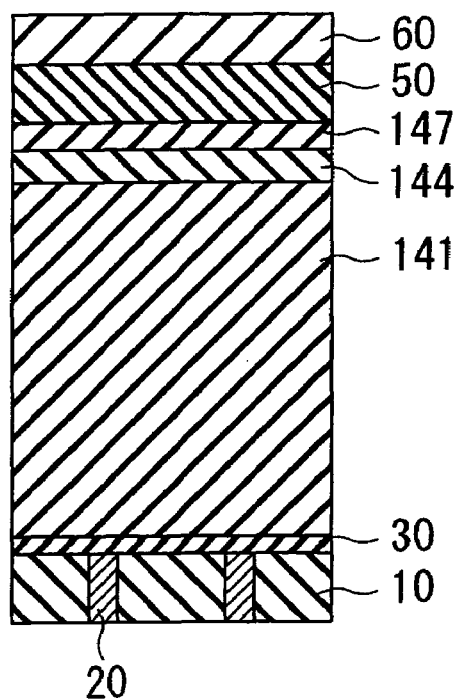
FIGS. 15 to 20 are views showing capacitor formation processes in accordance with a fourth embodiment of the present invention.

With reference to FIG. 15, after the formation of the conductive plug 20 and the silicon nitride film 30 in a manner similar to the first embodiment, an insulator layer 141 are deposited on the silicon nitride film 30. The insulator layer 141 is made of silicon oxide and has a thickness of 2000 nm. Then, a mark layer 144 is formed on the insulator layer 141 by. The mark layer 144 is made of silicon nitride and has a thickness of 200 nm. The mark layer may be made of tantalum oxide. Then, an additional insulator layer 147 is formed on the mark layer 144. The additional insulator layer 144 is made of silicon oxide and has a thickness of 300 nm. After the formation of the additional insulator layer 147, the hardmask 50 and the photoresist layer 60 are formed, as shown in FIG. 15.

Figure 16:
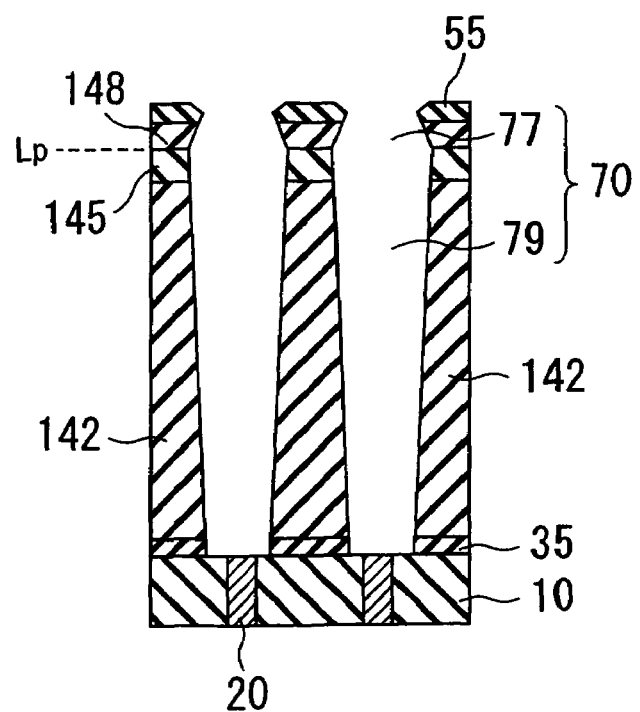

Then, in processes similar to those of FIGS. 2 and 3, the hole 70 is formed in the etched insulator layer 142, the etched mark layer 145 and the etched additional insulator layer 148, as shown in FIG. 16. With reference to FIG. 16, because the thickness of the additional insulator layer 147 is selected to 300 nm in consideration of the particular vase-shaped profile, the predetermined level Lp becomes equal to the top surface of the etched mark layer 145 so that the mark layer 145 can be used as an endpoint in the CMP process.

Figure 17:
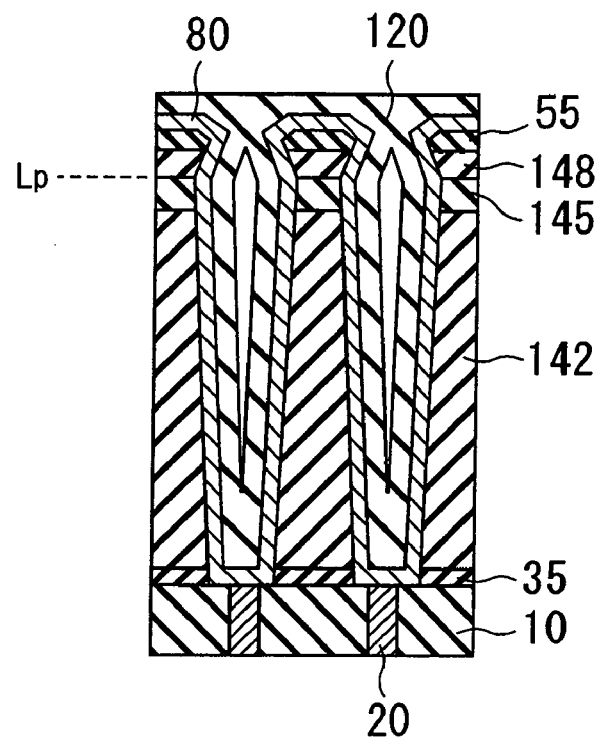

After the formation of the hole 70, the conductive film 80 is formed in a similar manner as shown in FIG. 4. Then, as shown in FIG. 17, the hole 70 is filled with the protective material 120 in a manner similar to the third embodiment, especially, as shown in FIG. 10.

Figure 18:
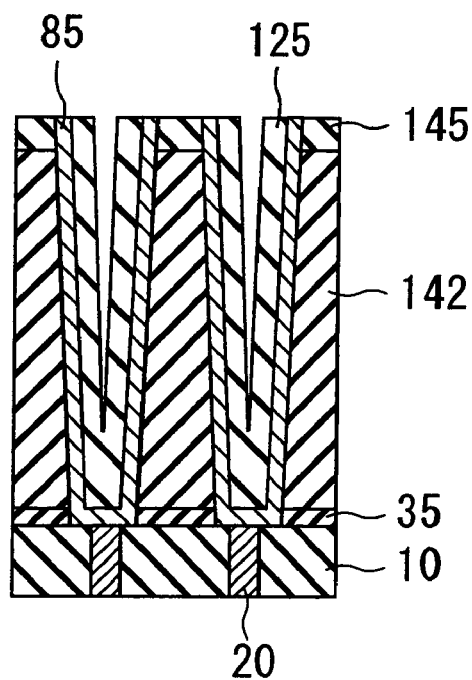

Next, the etched hardmask 55, the film 80, the etched additional insulator layer 148 and the protective material 120 are exposed to a CMP process to form a lower electrode 85 and the polished protective material 125, as shown in FIG. 18.

Figure 19:
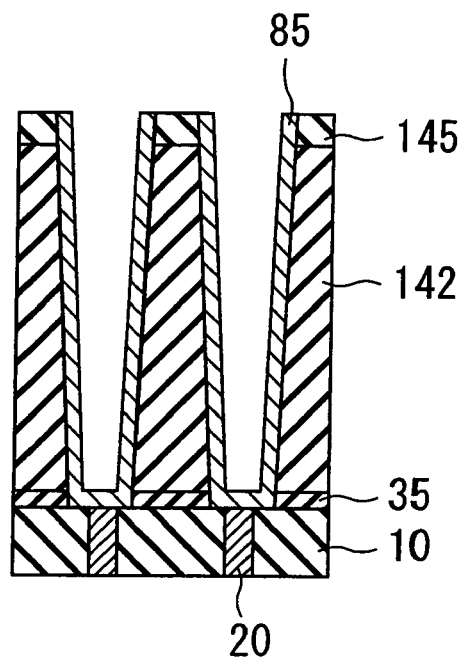

Next, the protective material 125 is removed by an HF solution etch process, as shown in FIG. 19. The HF solution etch process also removes residues such as slurry residues, while residues such as chippings are lifted off upon the removal of the protective material 125. On the other hand, the mark layer 145 made of silicon nitride is not etched in this embodiment so that the lower electrode 85 has no projecting rim, unlike the third embodiment.

Figure 20:
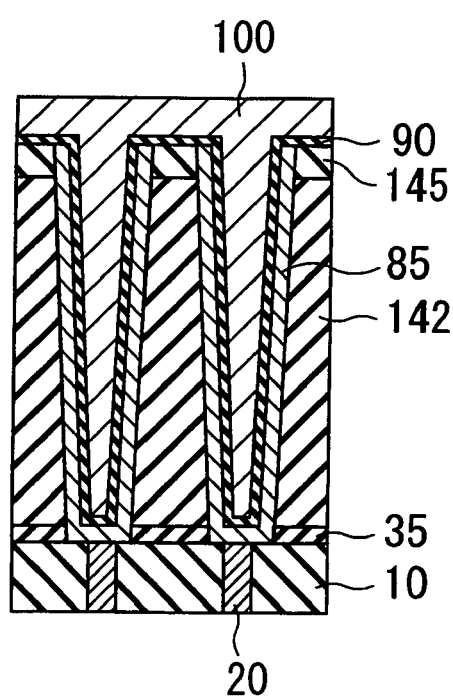

Next, the capacitor dielectric 90 is formed on the lower electrode 85 and the mark layer 145, and then the upper electrode 100 is formed on the capacitor dielectric 90, as shown in FIG. 20, so that the capacitor is obtained. Since the lower electrode 85 has no projecting rim so that the upper electrode has a flat top surface, unlike the third embodiment.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A method for forming a capacitor, comprising:
   providing a substrate with an insulator layer;
   forming a hole in the insulator layer, the hole having an opening, a side surface and a bottom surface, the side surface having a bowing shape in a plane perpendicular to the substrate;
   forming a film of a conductive material on the insulator layer and on the side surface and the bottom surface of the hole;
   exposing the film and the insulator layer to a chemical-mechanical polishing process to remove the film and the insulator in part in a direction perpendicular to the substrate so as to form a lower electrode of the conductive material and a polished insulator, the polished insulator defining a widened opening larger in size than the opening;
   forming a capacitor dielectric on the lower electrode; and forming an upper electrode on the capacitor dielectric, wherein forming the hole comprises:
  forming a hardmask with a patterned aperture on the insulator layer; and exposing the insulator layer to an anisotropic etch process by using the hardmask, wherein the hardmask is removed by the chemical-mechanical polishing process, and wherein
    the exposing the insulator layer to an anisotropic etch process is carried out so that the hole is provided with a particular vase-shaped profile; the particular vase-shaped profile has an upper section extending downwardly from the opening to a predetermined level and a lower section extending downwardly from the predetermined level to the bottom surface; the upper section has larger sizes with increased depths; and the lower section has smaller sizes with increased depths.

2. The method according to claim 1, wherein the chemical-mechanical polishing process is carried out until the lower electrode and the polished insulator have top surfaces at the predetermined level.

3. The method according to claim 1, wherein the chemical-mechanical polishing process is carried out until the insulator is removed by a thickness of 200 nm to 300 nm.

4. The method according to claim 1, wherein the forming a hole is carried out so that the hole has a depth of 2500 nm to 3000 nm.

5. The method according to claim 1, further comprising: filling the hole at least in part with a protective material before the chemical-mechanical polishing process, and removing the protective material after the chemical-mechanical polishing process.

6. The method according to claim 5, wherein the protective material is made of photoresist.

7. A method for forming a capacitor, comprising:
  providing a substrate with an insulator layer;
  forming a hole in the insulator layer, the hole having an opening, a side surface and a bottom surface, the side surface having a bowing shape in a plane perpendicular to the substrate;
  forming a film of a conductive material on the insulator layer and on the side surface and the bottom surface of the hole;
  exposing the film and the insulator layer to a chemical-mechanical polishing process to remove the film and the insulator in part in a direction perpendicular to the substrate so as to form a lower electrode of the conductive material and a polished insulator, the polished insulator defining a widened opening larger in size than the opening;
  filling the hole at least in part with a protective material before the chemical-mechanical polishing process, and removing the protective material after the chemical-mechanical polishing process;
  forming a capacitor dielectric on the lower electrode; and
  forming an upper electrode on the capacitor dielectric, wherein
  the filled protective material has a top surface; and the chemical-mechanical polishing process is finished before top surfaces of the lower electrode and the polished insulator reach the same height as the top surface of the protective material.

8. The method according to claim 5, wherein the protective material is made of a silicon oxide or another silicon oxide with impurities, whose wet etch rate is equal to or higher than that of the insulator layer in accordance with a particular wet etchant.

9. The method according to claim 8, wherein the protective material is formed by a chemical vapor deposition or spin coating.

10. A method for forming a capacitor, comprising:
  providing a substrate with an insulator layer;
  forming a hole in the insulator layer, the hole having an opening, a side surface and a bottom surface, the side surface having a bowing shape in a plane perpendicular to the substrate;
  forming a film of a conductive material on the insulator layer and on the side surface and the bottom surface of the hole;
  exposing the film and the insulator layer to a chemical-mechanical polishing process to remove the film and the insulator in part in a direction perpendicular to the substrate so as to form a lower electrode of the conductive material and a polished insulator, the polished insulator defining a widened opening larger in size than the opening;
  forming a capacitor dielectric on the lower electrode; and
  forming an upper electrode on the capacitor dielectric,
  the insulator layer comprising a base insulator layer, a mark layer formed on the base insulator layer and an additional insulator layer formed on the mark layer, wherein the mark layer serves as an end level of the chemical-mechanical polishing process.

11. The method according to claim 10, wherein the additional insulator layer has a thickness of 200 nm to 300 nm.

12. The method according to claim 10, wherein the protective material is made of photoresist.

13. The method according to claim 7, wherein the protective material is made of a silicon oxide or another silicon oxide with impurities, whose wet etch rate is equal to or higher than that of the insulator layer in accordance with a particular wet etchant.

* * * * *